United States Patent [19]
Khelemsky et al.

[11] Patent Number: 5,829,663
[45] Date of Patent: Nov. 3, 1998

[54] SELF LOCKING KEY FOR ULTRASONIC TRANSDUCERS

[75] Inventors: Valery Khelemsky, Holland; Ali Reza Safabakhsh, Yardley, both of Pa.

[73] Assignee: Kulicke and Soffa Investments, Inc., Willow Grove, Pa.

[21] Appl. No.: 717,319

[22] Filed: Sep. 20, 1996

[51] Int. Cl.$^6$ .................................................. H01L 21/607
[52] U.S. Cl. ............................................. 228/1.1; 228/904
[58] Field of Search ........................ 228/1.1, 4.5, 110.1, 228/180.5, 904; 219/56.21; 156/73.2, 580.1; 310/36

[56] References Cited

U.S. PATENT DOCUMENTS

| | | | |
|---|---|---|---|
| 5,180,093 | 1/1993 | Stansbury et al. | 228/1.1 |
| 5,368,216 | 11/1994 | Sakakura et al. | 228/1.1 |
| 5,469,011 | 11/1995 | Safabakhsh | 310/325 |
| 5,603,445 | 2/1997 | Hill et al. | 228/1.1 |
| 5,699,951 | 12/1997 | Miyoshi | 228/4.5 |
| 5,702,049 | 12/1997 | Biggs et al. | 228/4.5 |

*Primary Examiner*—Samuel M. Heinrich
*Attorney, Agent, or Firm*—John B. Sowell-ATT

[57] ABSTRACT

The present invention concerns a self locking system for holding a wire bonding tool in a wire bonding transducer and comprises an unitary cam key rotatably mounted in a cam key aperture extending through an anti-node end of an ultrasonic transducer. A cam surface on the cam key is operable to lock a bonding tool mounted in a substantially vertical bonding tool aperture when rotated less than 360° in said cam key aperture.

19 Claims, 3 Drawing Sheets

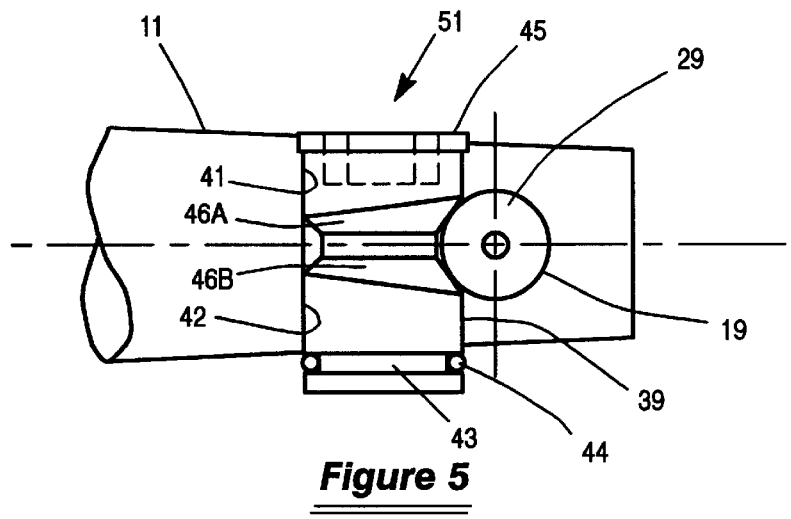
Figure 5
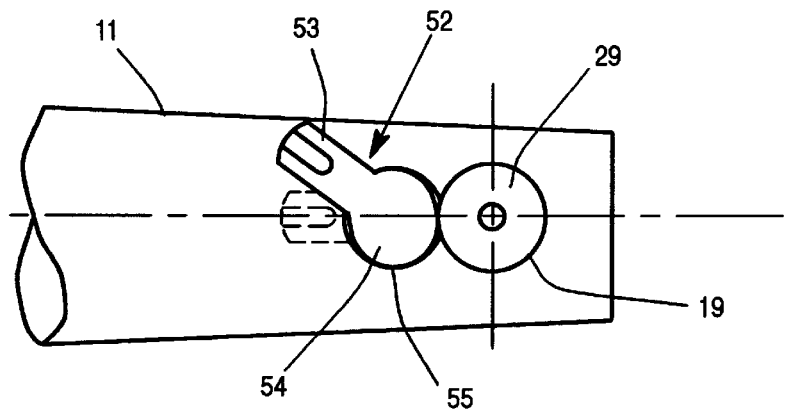
Figure 6
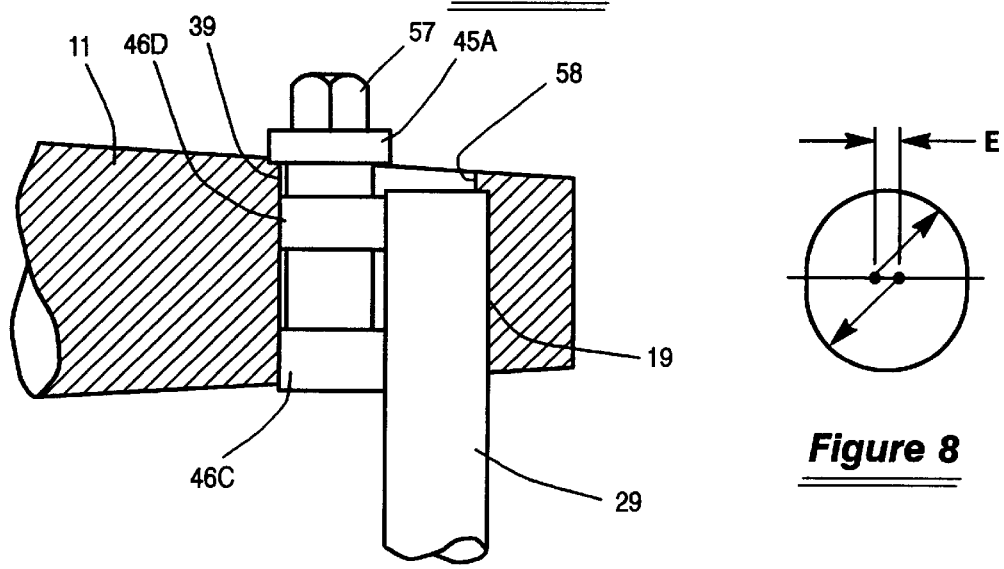
Figure 7
Figure 8

SELF LOCKING KEY FOR ULTRASONIC TRANSDUCERS

BACKGROUND OF THE INVENTION

1. Field of the Invention

The present invention relates to a clamping and locking device for holding a fine wire bonding tool in the end of an ultrasonic transducer.

2. Description of the Prior Art

Automatic fine wire bonders are used to make electrical wire interconnections from pads on a semiconductor device or chip to individual leads on lead frames or carriers before packaging the device as a component ready for mounting on a board or substrate. Automatic wire bonders are well known and are classified as wedge bonders or ball bonders depending on the type of bonding tool used. It is generally known that the time required to make fine wire bonded interconnections is reduced and the reliability of bonds are enhanced when the bonding tool is moved in a scrub motion by the assistance of ultrasonic energy applied through an ultrasonic transducer.

Automatic wire bonders may use one or more bonding tools on a single work shift after making over a million individual bonds. The force generated by an ultrasonic transducer on the bonding tool can cause wear of the transducer if the bonding tool is not held tightly in the aperture at the anti node end where the maximum displacement of the transducer takes place.

If any wear or looseness occurs, the coupling of energy from the transducer to the bonding tool is attenuated. Any loosening or miscoupling results in a loss of power. The ultrasonic generator used to drive the ultrasonic transducer is calibrated to drive at a predetermined resonance frequency and any large shift of the resonance frequency of the transducer will result in wire bonds having less than optimum strength or -even unacceptable bonds or bonds that are not properly connected to the bonding target.

While there are numerous other factors that effect the quality of bonds, wear of bonding tools and loss of power and shift of frequency are the primary factors. Accordingly, the coupling of the bonding tool is a factor that must be controlled in automatic wire bonders.

Heretofore, slits were placed in the transducer to permit the clamping device to deform the transducer and make surface to surface contact for good coupling. However, the threads of the clamping screws were not locking efficient and tended to lose power. Dutch key locking devices have been designed which apply a high clamping force directly to the bonding tool, however, wear at the point of contact of the Dutch keys with the bonding tool still permitted wear to occur which subsequently results in power loss.

It would be desirable to provide a device for applying a clamping force to a bonding tool in an ultrasonic transducer which has the minimum power loss and a maximum repeatability.

SUMMARY OF THE INVENTION

It is a principal object of the present invention to provide a novel clamping and locking device for holding a bonding tool in an ultrasonic transducer.

It is a principal object of the present invention to provide a self locking cam key for locking a bonding tool in a bonding tool aperture of an ultrasonic transducer.

It is another principal object of the present invention to provide a one piece cam key which has self locking cam surface means for locking a bonding tool in a bonding tool aperture.

It is yet another principal object of the present invention to provide a novel cam key without conventional screws for locking a bonding tool in an ultrasonic transducer with a single rotary motion comprising less than 180 degrees rotation.

According to these and other objects of the present invention there is provided a one piece cam key having at least one self locking cam key surface thereon. The one piece cam key is provided with a pair of bearing surfaces for rotational movement in a smooth substantially cylindrical bore extending through an ultrasonic transducer. When the cam key is rotated less than a full revolution the self locking cam key surface engages a bonding tool in a bonding tool aperture and causes a surface to surface self locking coupling to the bonding tool and urges the bonding tool into surface to surface coupling to the ultrasonic transducer.

BRIEF DESCRIPTION OF THE DRAWINGS

FIG. 5 is a section in plan view taken through a transducer showing another novel self locking cam key for positioning and locking a capillary bonding tool in a transducer by rotating the cam key in a horizontal aperture less than 180 degrees;

FIG. 6 is a top view of a transducer showing another type self locking cam key mounted for rotational movement in a vertical bore;

FIG. 7 is a section in elevation of the anti-node end of an ultrasonic transducer showing a modified cam key mounted in a vertical aperture; and FIG. 8 is a schematic drawing taken through the cam key of FIG. 7 showing a double offset cam surface;

DESCRIPTION OF THE PREFERRED EMBODIMENTS

Figure 1:
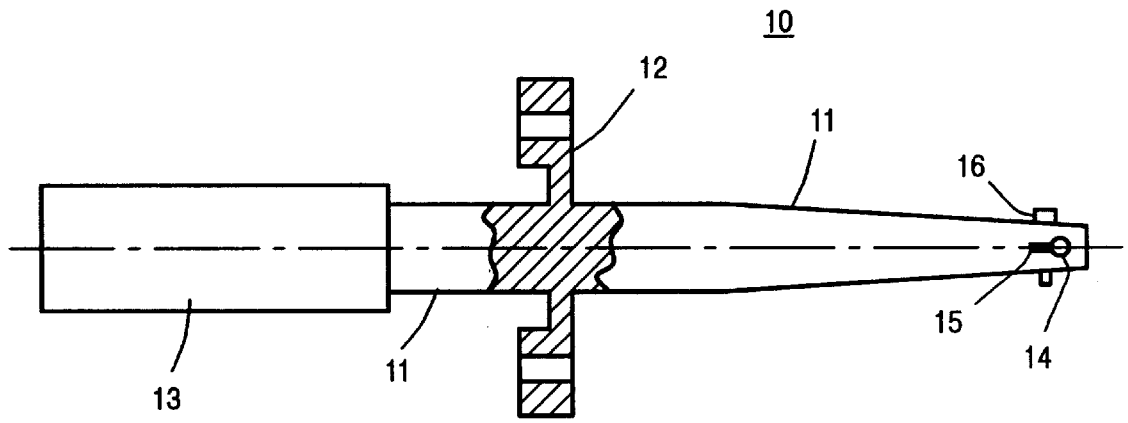
FIG. 1 is a plan view in partial section of a prior art tapered horn ultrasonic transducer 10.

Refer now to FIG. 1 showing a plan view in partial section of a prior art tapered horn ultrasonic transducer 10. Transducer 10 comprises a tapered horn end 11 and a mounting flange 12 which may be tightly fitted onto the horn or integral therewith. Transducer 10 further comprises a transducer driving element 13 which is preferably bolted to the horn end 11 by means not shown. The mounting flange 12 is connected to the horn end 11 at a node of the transducer system. At the working or anti-node end of the horn 11 there is provided an aperture 14 for receiving a capillary bonding tool therein. A vertical slot of slit 15 is provided in the transducer connecting with the aperture 14 to provide some clamping flexibility of the transducer when the cap screw 16 is tightened to hold a capillary in the aperture 14.

Figure 2:
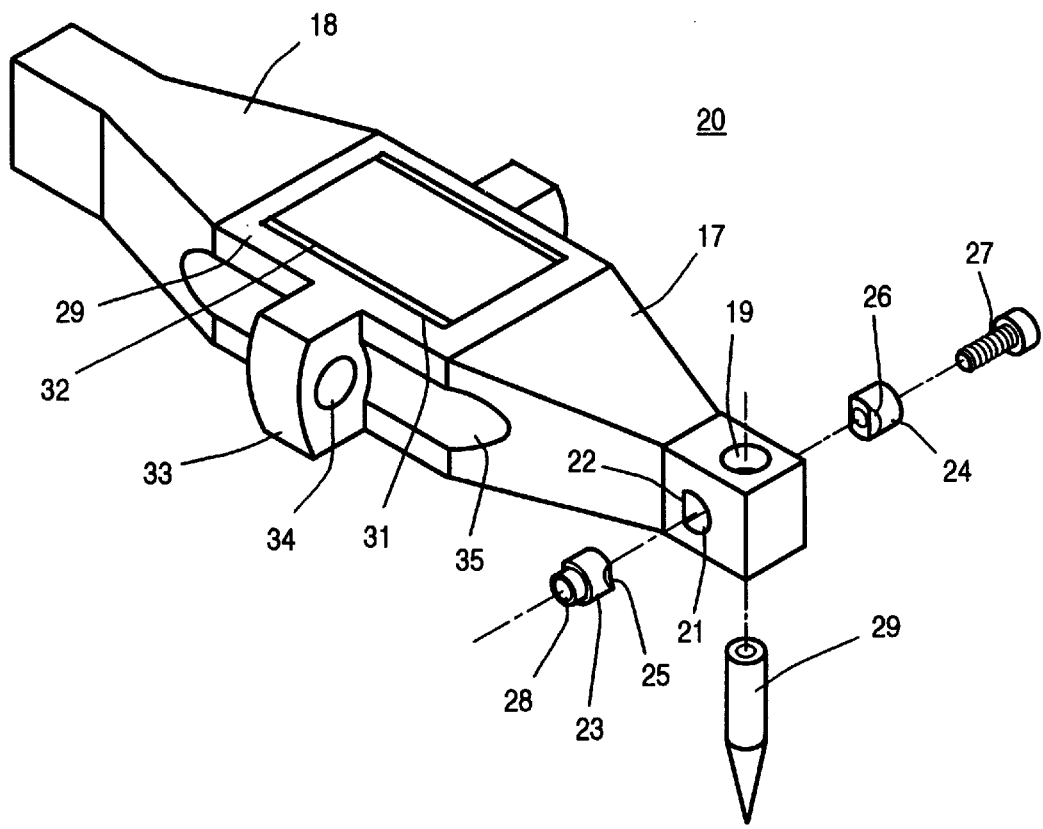
FIG. 2 is an isometric view of a state of the art unibody ultrasonic transducer 20 showing a Dutch key capillary locking mechanism.

FIG. 2 is an isometric view of a state-of-the-art unibody ultrasonic transducer 20 showing a Dutch key capillary locking mechanism. The transducer 20 comprises a front end portion 17 and a rear end portion 18 which are substantially symmetrical to the center of the transducer 20. In the front end there is provided a vertical aperture 19 for receiving a capillary 29 therein. Further there is provided a through hole 21 having a flat surface 22 thereon through the front end of the capillary at the anti-node. A split Dutch key comprising a threaded key portion 23 and a smooth bore portion 25 are slidably mounted in the through hole 21 and have flat face surfaces 25 and 26 thereon for clamping the capillary 29 when the cap screw 27 is tightened into the threads 28 of the key 23. It will be understood that the Dutch key comprises the two keys 23, 24 and the cap screw 27.

The center portion 29 of the unibody transducer 20 is provided with a rectangular aperture 31 for receiving a stack of pisso electric crystals 32. Symmetrical to the rectangular aperture 31 there is provided a mounting flange 33 connected to the center portion 29 at a node of the transducer 20. The mounting flanges 33 are provided with mounting holes 34 and the center portion of the body 29 is provided with recess means for bolts and tools for connecting the flange to a wire bonding head (not shown). The transducer 20 is the subject of a co-pending application U.S. Ser. No. 08/161,847 filed Dec. 6, 1993 for a unibody ultrasonic transducer.

Figure 3:
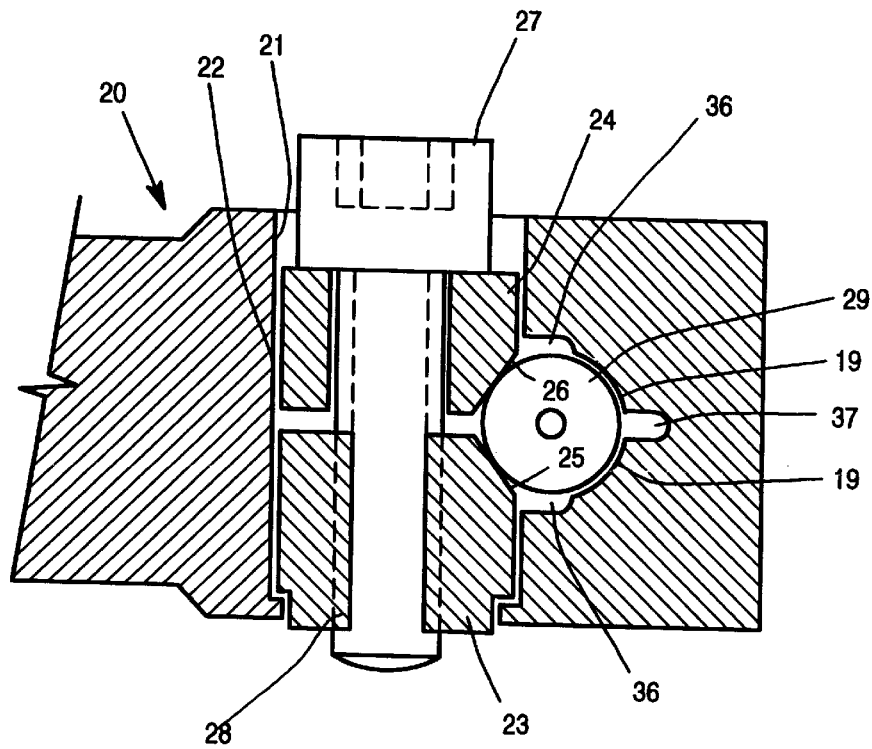
FIG. 3 is a detailed section in plan view taken through the Dutch key capillary locking mechanism of FIG. 2.

Refer now to FIG. 3 showing a detailed section in plan view taken through the Dutch key capillary locking mechanism shown in FIG. 2. The numerals used in FIG. 2 are identical to the numerals used in FIG. 3 and do not require additional explanation. It will be noted that the capillary 29 engages the flat places of the keys 25 and 26 along a tangent point and force the capillary 29 against the aperture 19 which is provided with recesses 36 and a slot 37 so that when the cap screw 27 is tightened into the threaded key element 23, the capillary 29 makes a surface to surface contact with the aperture 19, thus tightly coupling the capillary 29 to the anti-node in 17 of the transducer 20 body.

Figure 4C:
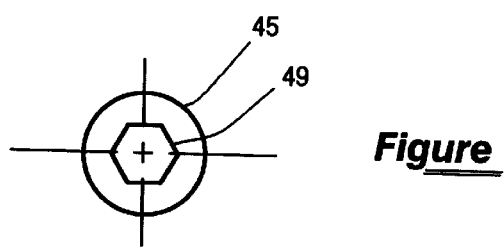
FIG. 4C is a side view looking into the end of the cam key.
Figure 4A:
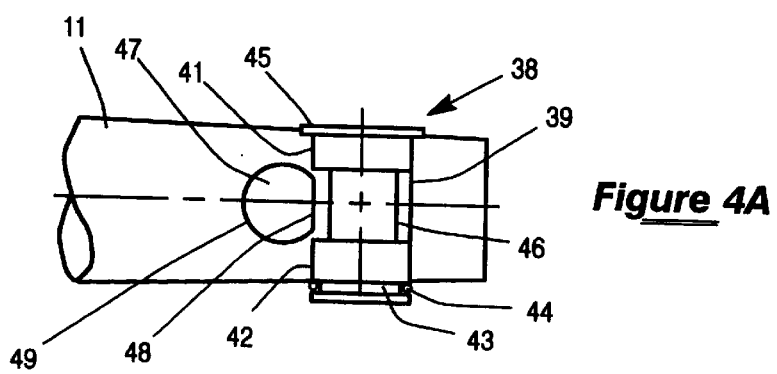
FIG. 4A is a detailed section in plan view taken through a horn type transducer showing the present invention novel one piece self locking cam key mounted in a horizontal cylindrical aperture bore extending through the transducer.
Figure 4B:
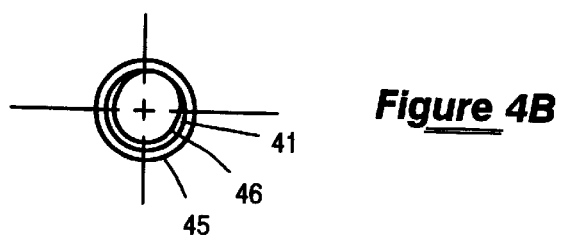
FIG. 4B is a section taken through the center of the novel cam key showing an eccentric cylindrical cam.

Refer now to FIG. 4A showing a detailed section in plan view taken through a horn type transducer 11 showing the present invention one piece self locking cam key 38 mounted in a horizontal bore or aperture 39 of the transducer 11. FIGS. 4B and 4C are side views of the novel cam key 38 and have the same numerals as FIG. 4A. The cam key 38 comprises a pair of concentric bearing surfaces 41 and 42 which fit into the smooth bore 39 and are held in place by an O-ring 44 in an annular groove 43 of the cam key and a flange 45 on the end opposite the O-ring. In the center of the cam key 38 between the concentric bearing surfaces 41 and 42 there is provided an eccentric cam surface 46 which when rotated moves into engagement with the flat surface 48 of the bonding wedge 47, thus tightly coupling the bonding wedge 47 in the bonding tool aperture 49. As shown in FIGS. 4B and 4C, the cam key 38 when rotated approximately 45 degrees will engage the flat surface 48 on the bonding wedge 47 while being rotated in the bore 39. A recess aperture 49 is provided in one end of the cam key for an Allen wrench, a recess or a protrusion, similar to recess 49 could be provided for rotating the cam key 38. In the preferred embodiment of the present invention the eccentric cam 46 has an effective contact inclined surface which locks the wedge 47 into the aperture 49 and tightly couples the wedge to the transducer 11.

Refer now to FIG. 5 showing a section in plan view taken through a transducer 11 showing another novel self locking cam key 51 for positioning and locking a capillary 29 in a vertical capillary aperture 19. The cam key 51 comprises a flange 45 on one end and an annular groove 43 having an O-ring 44 therein on the other end. Further there is provided a pair of concentric bearing surfaces 41 and 42 adjacent the ends of the cam key and positioned therebetween is provided a pair of eccentric cam surfaces 46A and 46B which engage the capillary 49 and tightly couple it into the capillary aperture 19 when rotated less than 180 degrees. In the preferred embodiment of the present invention, the cam key is inserted in the horizontal bore 39 and the O-ring 44 is fitted to hold the cam key in place while a capillary 29 is inserted in the aperture 19. Even though not shown, it will be understood that a lip or overhang surface (not shown) may be provided on the transducer horn 11 for positioning the capillary 29 in the aperture 19.

Refer now to FIG. 6 showing a top view of a transducer 11 illustrating another type of self locking cam key 52 which comprises a handle 53 connected to an eccentric cam 54 fitted in a vertical aperture or bore 55.

Refer now to FIG. 7 showing a section in elevation of the anti-node end of a transducer horn 11 having a further modified cam key 56 mounted in a vertical aperture 50. The cam key 56 is provided with a protrusion 57 extending from a flange 45A. When the cam key 56 is rotated by engaging the protrusion 57, a pair of eccentric cam surfaces 46D and 46C mounted in the bore 50 engage the sides of the capillary 29 and couple it to the capillary aperture 19 of the transducer 11. It will be noted that the capillary bore 19 is provided with a stop or lip 58 for accurately positioning the capillary 29 in the bore 19. The same positioning lip or flange 58 may be provided on other transducer embodiments as explained hereinbefore.

Refer now to FIG. 8 showing a schematic drawing taken through one of the eccentric cams 46D, 46C illustrating that the eccentric cam may essentially be made by offsetting two radii from each other so as to provide eccentric cam 46D or 46C and/or a cam of type employed in FIG. 6 for an eccentric cam 54.

Having explained a preferred embodiment of the present invention and several modifications thereof, it will be understood that all of the cam keys shown employ one or more eccentric cams which engage against the outside body of a wedge or capillary and force the wedge or capillary into a tight coupling engagement with an aperture in the transducer of the types shown in the figures. Further, the inclined surface of the cam is such that a self locking effect is achieved and the capillary cannot loosen in its aperture until released by the cam key. In the preferred embodiment of the present invention, the capillary or wedge may be locked into the transducer and not removed until completely worn out and needs replacement. It has been found that the self locking cam key will lock the bonding tool in the transducer so that the impedance of the load on the transducer remains substantially uniform during the life of the bonding tool as well as remaining substantially constant between replacement bonding tools.

Having explained a one piece cam key having a self locking cam surface thereon for locking both wedge and capillary bonding tools into the anti-node end of an ultrasonic transducer, it will be appreciated that the several features of the several embodiments may be interposed and exchanged with each other to provide further modifications and cam key locking systems. In the preferred embodiment, the apertures and bores for receiving the cam key and the bonding tool are preferably smooth cylindrical bores or modifications thereof which are substantially symmetric to a central axis extending through the transducer. By maintaining symmetry in a plan view, the transducer has little or no tendency to fishtail even when the transducer is energized before touchdown on a bonding target. Further, when the novel cam key is extended vertically upward and outward from the transducer as shown in FIG. 7 any tendency to whiplash in a vertical plane is substantially reduced. The shape of the cam keys and the apertures for receiving the cam keys and the apertures for receiving the bonding tools have been designed for minimizing the cost of manufacture and for optimizing the strength of the end of the transducer carrying the apertures so as to reduce stress concentrations. Thus, those skilled in the art will be able to design equivalent structures which are more complex and may have undesirable stress concentrations but also within the scope of the claims of the present invention which are appended hereto.

What is claimed is:

1. A self locking system for clamping a wire bonding tool in a wire bonding transducer, comprising:
   a wire bonding transducer having an anti-node end for receiving and holding a wire bonding tool,
   a bonding tool aperture extending substantially vertically through said anti-node end for receiving a bonding tool in surface to surface contact,
   a key aperture extending through said anti-node end,
   a unitary cam key mounted for rotation in said key aperture,
   said cam key having an eccentric self locking cam surface thereon for engagement with said bonding tool, and
   turning means on said cam key for rotating said eccentric self locking cam surface in said key aperture and for locking a wire bonding tool in said bonding tool aperture.

2. A self locking system as set forth in claim 1 wherein said cam key further comprises a pair of bearing surfaces for mounting said cam key in said key aperture.

3. A self locking system as set forth in claim 1 wherein said cam key self locking cam surface further comprises a bearing surface for mounting said cam key in said key aperture.

4. A self locking system as set forth in claim 1 wherein said cam key further comprises positioning means for aligning said cam key in said key aperture.

5. A self locking system as set forth in claim 4 wherein said positioning means comprise a flange on said cam key.

6. A self locking system as set forth in claim 5 wherein said positioning means further comprises a resilient ring in a recess.

7. A self locking system as set forth in claim 1 wherein the axis of said cam key and the axis of said bonding tool aperture are transverse to each other.

8. A self locking system as set forth in claim 1 wherein the axis of said cam key aperture and the axis of said bonding tool aperture are side by side in a vertical axis and have segments of their perimeters overlapping into each other.

9. A self locking system as set forth in claim 1 wherein said turning means comprise a male extension extending outward from said cam key.

10. A self locking system as set forth in claim 9 wherein said male extension comprises a handle connected to said eccentric self locking cam.

11. A self locking system as set forth in claim 1 wherein said cam key comprises a plurality of eccentric cam self locking surfaces thereon.

12. A self locking system as set forth in claim 11 wherein said plurality of eccentric cam self locking surfaces comprise a pair of identical cam surfaces.

13. A self locking system as set forth in claim 12 wherein said pair of identical cam surfaces comprises raised surfaces on the outer diameter of said eccentric cam key.

14. A self locking system as set forth in claim 12 wherein said pair of identical cam surfaces comprise recessed annular surface in the body of said cam key that are reflected images of each other.

15. A self locking system for holding a wire bonding tool in a wire bonding transducer, comprising:
    a wire bonding transducer having a substantially vertical aperture extending through an anti-node end of said transducer for receiving a bonding tool,
    a cam key aperture in said transducer occupying a part of the space of said vertical aperture,
    a cam key rotatably mounted in said cam key aperture, and
    cam surface means on said cam key operable to lock a bonding tool in said vertical aperture when said cam key is rotated less than 360° in said cam key aperture.

16. A self locking system as set forth in claim 15 wherein said cam key aperture comprises a smooth cylindrical bore.

17. A self locking system as set forth in claim 16 wherein said cam key further comprises a positioning flange thereon for positioning said cam key in said cam key aperture opposite a bonding tool.

18. A self locking system as set forth in claim 15 wherein said cam key further comprises a pair of cylindrical bearing surfaces on either side of said cam surface means.

19. A self locking system as set forth in claim 15 which further includes turning means for rotating said cam key in said cam key aperture.

* * * * *